United States Patent
Nasu

(10) Patent No.: US 8,067,993 B2
(45) Date of Patent: Nov. 29, 2011

(54) CONSTANT CURRENT DRIVEN OSCILLATING CIRCUIT

(75) Inventor: Kouji Nasu, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 36 days.

(21) Appl. No.: 12/683,531

(22) Filed: Jan. 7, 2010

(65) Prior Publication Data

US 2010/0182094 A1    Jul. 22, 2010

(30) Foreign Application Priority Data

Jan. 21, 2009   (JP) .................................. 2009-011272

(51) Int. Cl.
*H03B 5/36* (2006.01)

(52) U.S. Cl. ................. 331/116 FE; 331/158; 331/160; 331/185

(58) Field of Classification Search .................... 331/34, 331/116 FE, 116 M, 116 R, 154, 158, 160, 331/185, 186

See application file for complete search history.

(56) References Cited

U.S. PATENT DOCUMENTS

| 4,020,627 | A | * | 5/1977 | Yoshida et al. .................. 368/84 |
| 4,091,338 | A | * | 5/1978 | Morihisa .................. 331/116 FE |
| 6,097,257 | A | * | 8/2000 | Kadowaki et al. ...... 331/116 FE |
| 6,133,799 | A | * | 10/2000 | Favors et al. ..................... 331/57 |
| 6,411,169 | B1 | * | 6/2002 | Yabe et al. ............... 331/116 FE |

FOREIGN PATENT DOCUMENTS

| JP | 61-225904 | 10/1986 |
| JP | 06-097732 | 4/1994 |
| JP | 2001-298326 | 10/2001 |
| JP | 2008-219387 | 9/2008 |

* cited by examiner

*Primary Examiner* — Levi Gannon
(74) *Attorney, Agent, or Firm* — Volentine & Whitt, PLLC

(57) ABSTRACT

There is provided a constant current driven oscillating circuit including: an oscillator with first and second ends; a first field effect transistor that turns ON when a signal of a lower level than a first threshold voltage is input to a first gate terminal, and outputs, from a second terminal, current that has been input from a first terminal; a second field effect transistor turning ON when a signal output from the oscillator and is at a higher level than a second threshold voltage is input to a second gate terminal connected to the second end of the oscillator, and outputs, from a fourth terminal, current that has been input from a third terminal connected to the second terminal and to the first end of the oscillator; and an adjusting section that adjusts the first threshold voltage according to the level of the signal output from the oscillator.

4 Claims, 2 Drawing Sheets

CONSTANT CURRENT DRIVEN OSCILLATING CIRCUIT

CROSS-REFERENCE TO RELATED APPLICATION

This application is based on and claims priority under 35 USC 119 from Japanese Patent Application No. 2009-011272 filed on Jan. 21, 2009, the disclosure of which is incorporated by reference herein.

BACKGROUND

1. Technical Field

The present invention relates to an oscillating circuit which is driven by a constant current (constant current driven oscillating circuit), and in particular to a constant current driven oscillating circuit employed in a clock or the like of an LSI.

2. Related Art

Conventionally known is a constant current liquid crystal oscillating circuit that, in order to lower power consumption, employs an oscillation stop control signal, and stops oscillating operation of the oscillating circuit during an oscillation stop mode (see Japanese Patent Application Laid-Open (JP-A) No. 61-225904).

Furthermore, in order to lower power consumption, there is also a liquid crystal oscillating circuit that, by lowering a back gate electric potential of an N-channel field effect transistor (referred so as an N-MOSFET below) of a CMOS inverter when power is introduced using a switching circuit, thereby lowering the threshold voltage, has speedy start up of the liquid crystal oscillating circuit, from when power is introduced up to the point when a stable oscillating state is achieved, and then after stable oscillation has been achieved in the liquid crystal oscillating circuit, raises the threshold voltage by raising the back gate electric potential of the N-MOSFET, thereby reducing power consumption (JP-A No. 2001-298326).

Furthermore, there is an oscillating circuit that, in order to perform oscillating operation at a low power source voltage, lowers a gate voltage input to a gate terminal of a P-channel field effect transistor (referred to below as a P-MOSFET) of a CMOS inverter, using an voltage lowering circuit, with an accompanying increase in the drain current (JP-A No. 6-97732).

Furthermore, there is a constant current driven liquid crystal oscillating circuit that makes a gate signal for input to the gate terminal of a P-MOSFET of a CMOS inverter constant, and makes the drain current flowing of the P-MOSFET constant by the P-MOSFET constantly being in a conducting state, and suppresses the penetration current that occurs when the P-MOSFET and an N-MOSFET are both conducting at the same time (JP-A No. 2008-219387).

However, the constant current liquid crystal oscillating circuit described in JP-A No. 61-225904 is merely a technique to reduce power consumption by stopping the oscillating circuit when oscillating operation is not required, and cannot reduce power consumption during oscillating operation.

Moreover, the liquid crystal oscillating circuit described in JP-A No. 2001-298326 uses a switching circuit to raise the back gate electric potential of the N-MOSFET of a CMOS inverter and to raise the threshold voltage of the N-MOSFET, and therefore the circuit configuration is complicated.

Furthermore, the oscillating circuit described in JP-A No. 6-97732 merely performs oscillating operation at a low power source voltage, and when the N-MOSFET of the CMOS inverter is in the ON state, the drain current that flows to the N-MOSFET via the P-MOSFET is wasted.

Furthermore, the constant current driven oscillating circuit described in JP-A No. 2008-219387 merely makes the drain current flowing to the P-MOSFET of the CMOS inverter constant and suppresses the penetrating current, and similar to in JP-A No. 6-97732, when the N-MOSFET is in the ON state, the drain current flowing to the N-MOSFET via the P-MOSFET is wasted.

SUMMARY

The present invention is made in to solve the above issues, and an objective thereof is to provide a constant current driven oscillating circuit with a simple configuration that can maintain margin for oscillation in an oscillator at low current consumption, by adjusting the threshold voltage of a field effect transistor based on the level of a signal output from the oscillator.

A first aspect of the present invention provides a constant current driven oscillating circuit including:

an oscillator with a first end and a second end;

a first field effect transistor having a first terminal, a second terminal and a first gate terminal, that turns ON when a signal of a lower level than a first threshold voltage is input to the first gate terminal, and outputs, from the second terminal, current that has been input from the first terminal;

a second field effect transistor having a third terminal, a fourth terminal and a second gate terminal, the third terminal being connected to the second terminal and to the first end of the oscillator, and the second gate terminal being connected to the second end of the oscillator, the second field effect transistor turning ON when a signal that is output from the oscillator and is at a higher level than the second threshold voltage is input to the second gate terminal, and outputs, from the fourth terminal, current that has been input from the third terminal; and an adjusting section that, when the first field effect transistor turns ON, adjusts the first threshold voltage according to the level of the signal output from the oscillator.

According to the first aspect of the present invention, the second field effect transistor adopts an ON state when a signal that is output from the oscillator is at a higher level than the second threshold voltage, and the first threshold voltage of the first field effect transistor is adjusted so as to be smaller by the adjusting section, and the current flowing to the second field effect transistor becomes smaller, so power consumption of the second field effect transistor can be reduced.

A second aspect of the present invention provides the constant current driven oscillating circuit of the first aspect, wherein the adjusting section including:

a resistor, the first end of the resistor being connected to a power source and the second end of the resistor being connected to a back gate terminal of the first field effect transistor; and a condenser, a first electrode of the condenser being connected to the second end of the resistor, and a second electrode of the condenser being connected to the gate terminal of the second field effect transistor.

According to the second aspect of the present invention, the circuit configuration can be made simple, since the adjusting section is configured with a resistor, the first end of the resistor being connected to a power source and the second end of the resistor being connected to a back gate terminal of the first field effect transistor, and a condenser, a first electrode of the condenser being connected to the second end of the resistor, and a second electrode of the condenser being connected to the gate terminal of the second field effect transistor.

A third aspect of the present invention provides the constant current driven oscillating circuit of the first aspect, further including:

a return resistor having a first end connected to the gate terminal of the second field effect transistor, and a second end connected to the third terminal of the second field effect transistor.

According to the third aspect of the present invention, since the signal that has been output from the output terminal of the oscillator is input to the input terminal of the oscillator via the return resistor, continuous oscillation can be performed.

A fourth aspect of the present invention provides the constant current driven oscillating circuit of the first aspect, wherein the first field effect transistor is a P-channel field effect transistor, and the second field effect transistor is an N-channel field effect transistor.

According to the fourth aspect of the present invention, power consumption can be lowered, since the first field effect transistor is configured with a P-channel field effect transistor for, and the second field effect transistor is configured with an N-channel field effect transistor.

A fifth aspect of the present invention provides the constant current driven oscillating circuit of the first aspect, wherein the oscillator including a liquid crystal oscillator element, a first condenser connected to a first electrode of the liquid crystal oscillator element, and a second condenser connected to a second electrode of the liquid crystal oscillator element.

According to the fifth aspect of the present invention, by configuration of the oscillator including a liquid crystal oscillator element, a first condenser connected to a first electrode of the liquid crystal oscillator element, and a second condenser connected to a second electrode of the liquid crystal oscillator element, application can also be made to cases where a liquid crystal oscillator element of different oscillating frequency is employed.

With the present invention as explained above, since the threshold voltage of the first field effect transistor becomes smaller as the level of the signal output from the oscillator gets higher, the current flowing to the second field effect transistor when the second field effect transistor is ON becomes smaller, and the margin for oscillation can be maintained with a simple circuit configuration, and with low current usage.

BRIEF DESCRIPTION OF THE DRAWINGS

Exemplary embodiments of the present invention will be described in detail based on the following figures, wherein.

DETAILED DESCRIPTION

Explanation will now be given of details of an exemplary embodiment of the present invention, with reference to the drawings.

Figure 1:
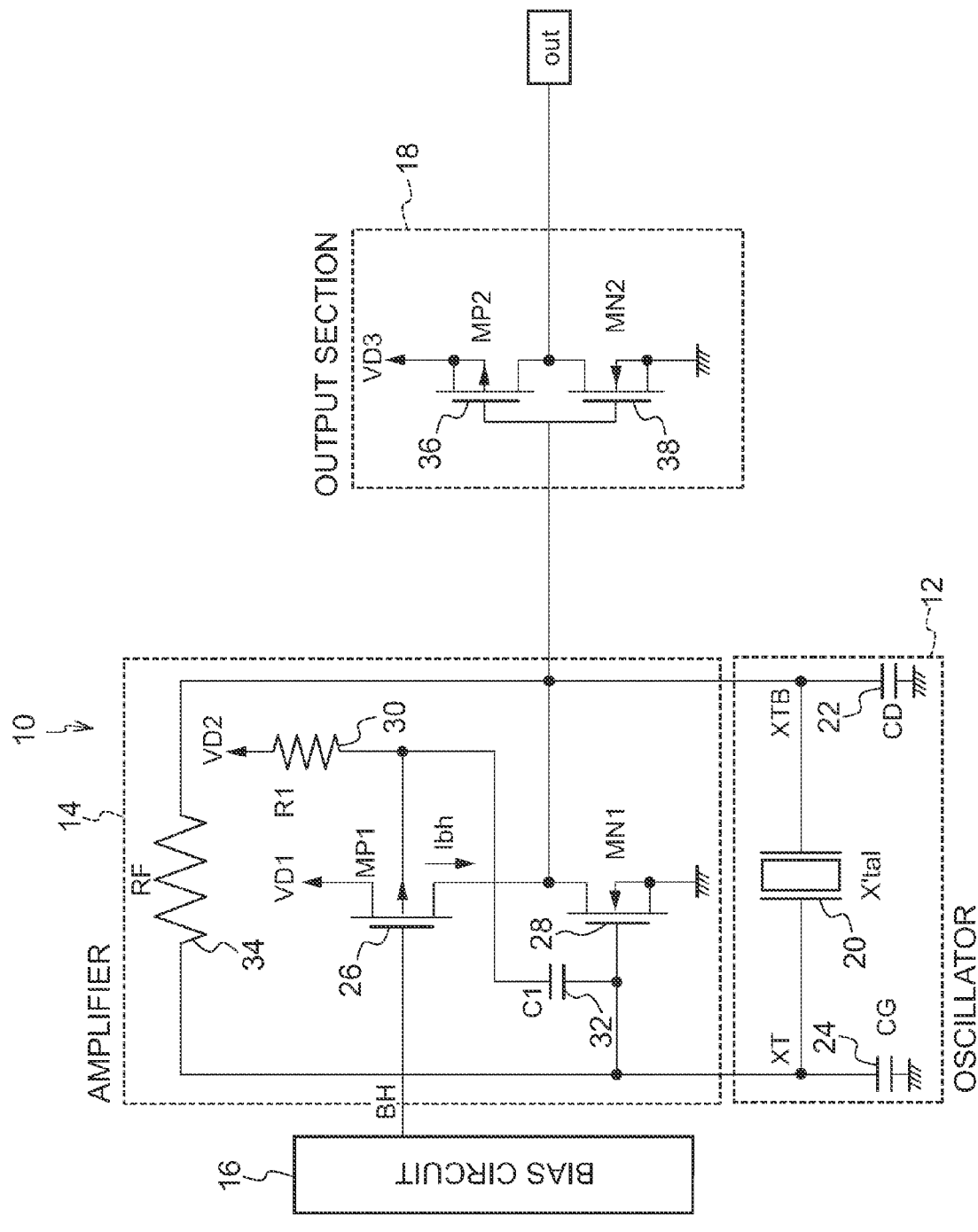
FIG. 1 is a circuit diagram of a constant current driven oscillator circuit according to the present exemplary embodiment.

As shown in FIG. 1, a constant current driven oscillating circuit 10 according to the present exemplary embodiment is configured including an oscillator 12, an amplifier 14, a bias circuit 16, and an output section 18.

The oscillator 12 is configured including a liquid crystal oscillator element 20 that oscillates a signal input from a node XTB (an input terminal) so as to give a signal of a specific frequency, and two condensers, a condensers 22 and a condenser 24, that adjust the oscillation frequency of the signal output from the liquid crystal oscillator element 20.

A first electrode of the liquid crystal oscillator element 20 is connected to the node XTB and also connected to ground via the condenser 22, and a second electrode of the liquid crystal oscillator element 20 is connected to a node XT (an output terminal) and also connected to ground via the condenser 24.

The amplifier 14 is configured including a P-MOSFET 26, an N-MOSFET 28, a resistor 30, a condenser 32 that removes any direct current component, and a return resistor 34.

The gate terminal of the P-MOSFET 26 is connected to the bias circuit 16, the source terminal thereof is connected to a power source VD1, the drain terminal thereof is connected to the drain terminal of the N-MOSFET 28, and the back gate terminal thereof is connected to a power source VD2 via the resistor 30, as well as being connected to the gate terminal of the N-MOSFET 28 via the condenser 32.

The gate terminal of the N-MOSFET 28 is connected to the second electrode of the liquid crystal oscillator element 20 and to the condenser 24, and is also connected to a first end of the return resistor 34, the drain terminal thereof is connected to the first electrode of the liquid crystal oscillator element 20 and connected to the condenser 22, as well as being connected to a second end of the return resistor 34, and the source terminal and the back gate terminal thereof are connected to ground.

The output section 18 is configured by a P-MOSFET 36 and an N-MOSFET 38.

The gate terminal of the P-MOSFET 36 is connected to the gate terminal of the N-MOSFET 38, and also connected to the first electrode of the liquid crystal oscillator element 20, the condenser 22, the drain terminal of the P-MOSFET 26, the drain terminal of the N-MOSFET 28, and the second end of the return resistor 34. The source terminal of the P-MOSFET 36 is connected to a power source VD3, the drain terminal thereof is connected to the drain terminal of the N-MOSFET 38 and also connected to the output terminal.

The source terminal of the N-MOSFET 38 is connected to ground.

If the voltage input to the back gate terminal of the P-MOSFET 26 here is denoted VD, the voltage applied to the source terminal of the P-MOSFET 26 is denoted VD1, the threshold voltage of the diode component between the source terminal and the back gate terminal of the P-MOSFET 26 is denoted Vf, then when VD<0 and VD<(VD1−Vf), VD1 is made so as to satisfy VD1<VD2 in order to prevent current flowing between the source terminal and the back gate terminal of the P-MOSFET 26.

Furthermore, in order to output the electric potential VXT of the node XT as VD based on voltage VD2 of the power source, the resistance value of resistor 30 is set high, for example 100 (MΩ).

Explanation will now be given of the operation of the constant current driven oscillating circuit 10.

Explanation will be given with the threshold voltage of the N-MOSFET 28 denoted specific voltage Vtn, the gate signal input to the gate terminals of the P-MOSFET 36 and the N-MOSFET 38 denoted Vg, and the threshold voltage of the P-MOSFET 36 and the N-MOSFET 38 denoted as V'th.

When a signal BH (referred to below as a bias signal) of a lower level than the threshold voltage of the P-MOSFET 26 is input from the bias circuit 16 to the gate terminal of the P-MOSFET 26, the P-MOSFET 26 adopts an ON state, and current input to the source terminal of the P-MOSFET 26 flows out from the drain terminal, and a drain current Ibh flows from the source terminal to the drain terminal.

The bias circuit 16 constantly inputs a constant level of bias signal BH to the gate terminal of the P-MOSFET 26, therefore in the state in which the threshold voltage is the specific voltage Vtn, the P-MOSFET 26 is constantly in the ON state, and the drain current Ibh constantly flows.

The drain current Ibh flows toward the condenser 22 and charges the condenser 22, and flows to the first electrode of the liquid crystal oscillator element 20.

The drain current Ibh that has flowed to the first electrode of the liquid crystal oscillator element 20 oscillates, based on the oscillation frequency of the liquid crystal oscillator element 20.

Figure 2:
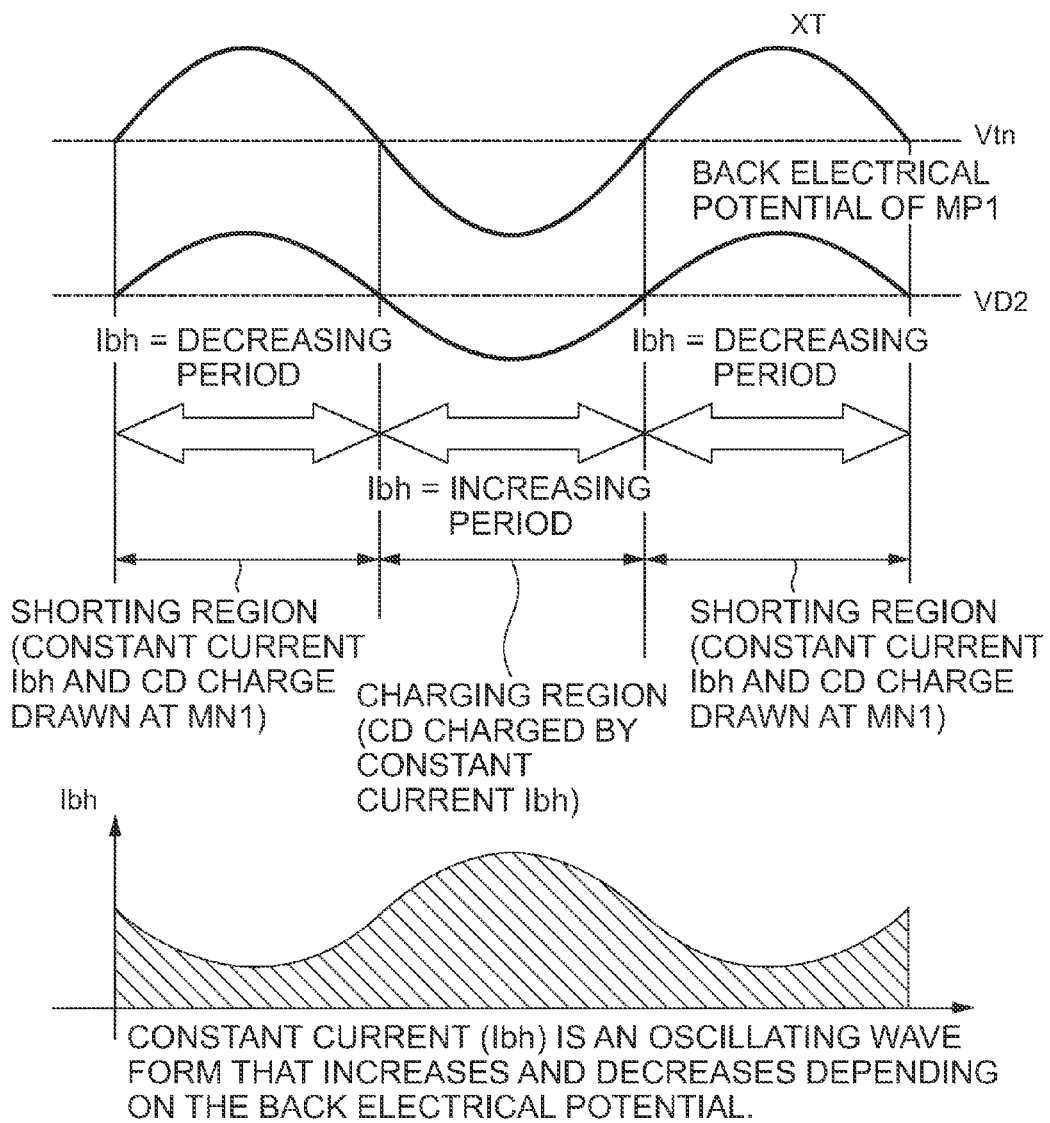
FIG. 2 is a waveform diagram of a constant current driven oscillating circuit according to the present exemplary embodiment.

The signal oscillated by the liquid crystal oscillator element 20 is a sine wave as shown in FIG. 2, becomes a signal of VST≦Vtn (increasing period of Ibh), or a signal of VXT>Vtn (decreasing period of Ibh), output from the node XT, and returned by the return resistor 34 toward the first electrode of the liquid crystal oscillator element 20, and is input to the gate terminal of the P-MOSFET 36 and the N-MOSFET 38 while continuing to oscillate.

When VXT≦Vtn, namely in the increasing period of the Ibh, the charge that has charged the condenser 32 makes the electrode connected to the resistor 30 a positive polarity, and so the back electric potential VD satisfies VD=VD2−(+VXT).

When the value of the back electric potential VD becomes smaller, since the depletion layer of the N-substrate of the P-MOSFET 26 becomes narrower, the threshold voltage of the P-MOSFET 26 becomes large, and as shown in FIG. 2, the amount of the drain current Ibh flowing in the P-MOSFET 26 becomes large.

The electric potential VXT of the node XT is inverted and amplified by the return resistor 34 and input to the gate terminals of the P-MOSFET 36 and the N-MOSFET 38, therefore Vg becomes to satisfy Vg>V'th, the P-MOSFET 36 adopts an OFF state and the N-MOSFET 38 adopts an ON state, and the signal output to the output terminal (out) is at a low level.

When VXT>Vtn, namely in the decreasing section of the Ibh, the N-MOSFET 28 adopts the ON state, and charge that is charged in the condenser 22 is dissipated, part of the dissipating current flowing with the drain current Ibh of the P-MOSFET 36 to ground, and the other part of the dissipating current flowing to the second electrode of the liquid crystal oscillator element 20 via the return resistor 34.

The dissipating current that has flowed to the second electrode of the liquid crystal oscillator element 20 oscillates, based on the oscillation frequency of the liquid crystal oscillator element 20.

The oscillated signal is returned toward the second electrode of the liquid crystal oscillator element 20 by the return resistor 34, while continuing to oscillate.

The charge that has been charged in the condenser 32 makes the electrode connected to the resistor 30 a negative polarity, and so the back electric potential VD satisfies VD=VD2−(−VXT).

When the value of the back electric potential VD becomes large, since the depletion layer of the N-substrate of the P-MOSFET 26 becomes wider, the threshold voltage of the P-MOSFET 26 becomes smaller, and, as shown in FIG. 2, the amount of the drain current Ibh flowing of the P-MOSFET 26 becomes smaller.

Since the electric potential VXTB of the node XTB is input to the gate terminals of the P-MOSFET 36 and the N-MOSFET 38, V'th becomes to satisfy V'th>Vg, the P-MOSFET 36 adopts the ON state and the N-MOSFET 38 adopts an OFF state, and the signal output from the output terminal is high level.

As explained above, in the constant current driven oscillating circuit according to the present exemplary embodiment, the threshold voltage of the P-channel electric field effect transistor of the amplifier section becomes smaller as the level of the signal output from the oscillator gets higher, and the margin for oscillation of the oscillator can be maintained with a simple circuit configuration, and with low current usage.

Note that in the present exemplary embodiment, explanation has been given of a case in which the liquid crystal oscillator element 20 is employed, however a ceramic oscillator element, a CR oscillator circuit, or an LC oscillator circuit may be employed.

What is claimed is:

1. A constant current driven oscillating circuit comprising:
an oscillator with a first end and a second end;
a first field effect transistor having a first terminal, a second terminal and a first gate terminal, that turns ON when a signal of a lower level than a first threshold voltage is input to the first gate terminal, and outputs, from the second terminal, current that has been input from the first terminal;
a second field effect transistor having a third terminal, a fourth terminal and a second gate terminal, the third terminal being connected to the second terminal and to the first end of the oscillator, and the second gate terminal being connected to the second end of the oscillator, the second field effect transistor turning ON when a signal that is output from the oscillator and is at a higher level than the second threshold voltage is input to the second gate terminal, and outputs, from the fourth terminal, current that has been input from the third terminal; and
an adjusting section that, when the first field effect transistor turns ON, adjusts the first threshold voltage according to the level of the signal output from the oscillator, the adjusting section comprising:
a resistor, the first end of the resistor being connected to a power source and the second end of the resistor being connected to a back gate terminal of the first field effect transistor; and
a condenser, a first electrode of the condenser being connected to the second end of the resistor, and a second electrode of the condenser being connected to the gate terminal of the second field effect transistor.

2. The constant current driven oscillating circuit of claim 1, further comprising:
a return resistor having a first end connected to the gate terminal of the second field effect transistor, and a second end connected to the third terminal of the second field effect transistor.

3. The constant current driven oscillating circuit of claim 1, wherein the first field effect transistor is a P-channel field effect transistor, and the second field effect transistor is an N-channel field effect transistor.

4. The constant current driven oscillating circuit of claim 1, the oscillator comprising a liquid crystal oscillator element, a first condenser connected to a first electrode of the liquid crystal oscillator element, and a second condenser connected to a second electrode of the liquid crystal oscillator element.

* * * * *